(12) United States Patent
Guenther et al.

(10) Patent No.: US 7,026,758 B2
(45) Date of Patent: Apr. 11, 2006

(54) REINFORCEMENT OF GLASS SUBSTRATES IN FLEXIBLE DEVICES

(75) Inventors: Ewald Guenther, Singapore (SG); Ong Kian Soo, Singapore (SG)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 09/968,165

(22) Filed: Sep. 28, 2001

(65) Prior Publication Data

US 2003/0062830 A1    Apr. 3, 2003

(51) Int. Cl.
    *H05B 33/04* (2006.01)
(52) U.S. Cl. .................. 313/511; 313/512; 313/504
(58) Field of Classification Search .......... 313/504, 313/505, 506, 512, 511, 25; 428/690, 917; 257/40, 100
See application file for complete search history.

(56) References Cited

U.S. PATENT DOCUMENTS

| | | | | |
|---|---|---|---|---|
| 3,315,111 A | * | 4/1967 | Jaffe et al. ................... | 313/503 |
| 5,003,222 A | * | 3/1991 | Washo .......................... | 313/511 |
| 5,019,944 A | * | 5/1991 | Ishii et al. .................... | 361/783 |
| 5,386,342 A | * | 1/1995 | Rostoker ....................... | 361/749 |
| 5,491,377 A | * | 2/1996 | Janusauskas ................ | 313/506 |
| 5,771,562 A | * | 6/1998 | Harvey et al. .............. | 29/592.1 |
| 5,804,917 A | * | 9/1998 | Takahashi et al. ........... | 313/504 |
| 6,010,742 A | * | 1/2000 | Tanabe et al. ................ | 427/66 |
| 6,111,357 A | * | 8/2000 | Fleming et al. .............. | 313/509 |
| 6,195,142 B1 | | 2/2001 | Gyotoku et al. .............. | 349/69 |
| 6,198,220 B1 | * | 3/2001 | Jones et al. .................. | 313/512 |
| 6,284,342 B1 | * | 9/2001 | Ebisawa et al. .............. | 428/69 |
| 6,310,667 B1 | * | 10/2001 | Nakayoshi et al. ........... | 349/42 |
| 6,436,222 B1 | * | 8/2002 | Andre et al. .............. | 156/272.8 |
| 6,607,135 B1 | * | 8/2003 | Hirai et al. .................. | 235/487 |
| 6,664,137 B1 | * | 12/2003 | Weaver ....................... | 438/125 |

FOREIGN PATENT DOCUMENTS

| | | |
|---|---|---|
| DE | 42 24103 A1 | 1/1994 |
| DE | 19611237 A1 | 9/1997 |
| WO | WO 0065670 A1 | 11/2000 |
| WO | WO 0104963 A1 | 1/2001 |
| WO | WO 0105205 A1 | 1/2001 |
| WO | WO 0119142 A1 | 3/2001 |
| WO | WO 0133487 A2 | 5/2001 |

* cited by examiner

*Primary Examiner*—Karabi Guharay
(74) *Attorney, Agent, or Firm*—Fish & Richardson P.C.

(57) ABSTRACT

A reinforcement technique used in the fabrication of displays, such as organic light emissive diode (OLED) display, is disclosed. A stiff reinforcement lid is mounted on a thin substrate to encapsulate the OLED cells. The lid serves to reinforce the thin flexible substrate and protect it from breakage. It comprises preferably of metal or other materials that have higher stiffness and ductility than the thin substrate. The fabricated display is compatible for integration into chip cards and other flexible applications.

62 Claims, 7 Drawing Sheets

REINFORCEMENT OF GLASS SUBSTRATES IN FLEXIBLE DEVICES

FIELD OF THE INVENTION

The present invention relates to displays, such as organic light emitting diode (OLED) displays. More particularly, the invention relates OLED displays, which are compatible for integration in chip cards or other thin flexible applications.

BACKGROUND OF THE INVENTION

FIG. 1 shows a conventional OLED device 100. The OLED device comprises one or more organic functional layers 110 between first and second electrodes 105 and 115 formed on a substrate 101. The electrodes can be patterned to form, for example, a plurality of OLED cells to create a pixelated OLED device. Bond pads 150, which are coupled to the first and second electrodes, are provided to enable electrical connections to the OLED cells. A cap 160 is formed over the substrate to encapsulate the device, protecting the OLED cells from the environment such as moisture and/or air.

The substrate is preferably made from glass due to its good barrier properties against moisture or air. Glass substrates provide other advantages including a smooth surface, temperature and dimensional stability as well as availability of raw materials and processes.

For flexible applications, such as chip cards, the overall device thickness of the devices need to be less than about 0.6 mm. As such, conventional OLEDs are incompatible since they are too thick and are typically more than 2 mm thick. To reduce the overall thickness and impart mechanical flexibility, thin or ultra thin glass substrates having a thickness of less than 0.4 mm are used. However, the thin glass substrates are fragile and susceptible to breakage due to mechanical stress, such as bending of the chip card.

As evidenced from the above discussion, it is desirable to provide a thin flexible device formed of a thin glass substrate that is not susceptible to breakage.

SUMMARY OF THE INVENTION

The invention relates generally to OLED devices. In particular, the invention relates to the reinforcement and stabilization of displays especially OLED devices on ultra thin substrates, integrated into chip cards and other flexible applications.

In accordance with the invention, a reinforcement technique is provided for flexible displays. In one embodiment of the invention, a stiff and ductile cover lid is mounted on an ultra thin flexible glass substrate containing OLED devices. The cover lid comprises preferably of metal, or other materials that have higher stiffness and ductility than the substrate to protect it from breakage. The lid and substrate are sealed to encapsulate the OLED devices and protect them from environmental and mechanical damage.

The thickness of the fabricated OLED display is less than 0.6 mm. It is suitable for integration into chip cards or other thin flexible applications. The reinforcement protects the ultra thin substrates from breakage and does not affect the flexibility of the substrate. The process is suitable for large area, cost effective mass production.

PREFERRED EMBODIMENTS OF THE INVENTION

The invention relates generally to flexible devices formed on thin substrates. In one embodiment of the invention, a flexible OLED device is formed on a thin glass substrate. In one embodiment of the invention, a stiff and ductile metal cover is mounted on the substrate to reinforce it and prevent it from breaking. The OLED device is particularly useful in thin flexible surfaces, for example, chip cards.

Figure 1:
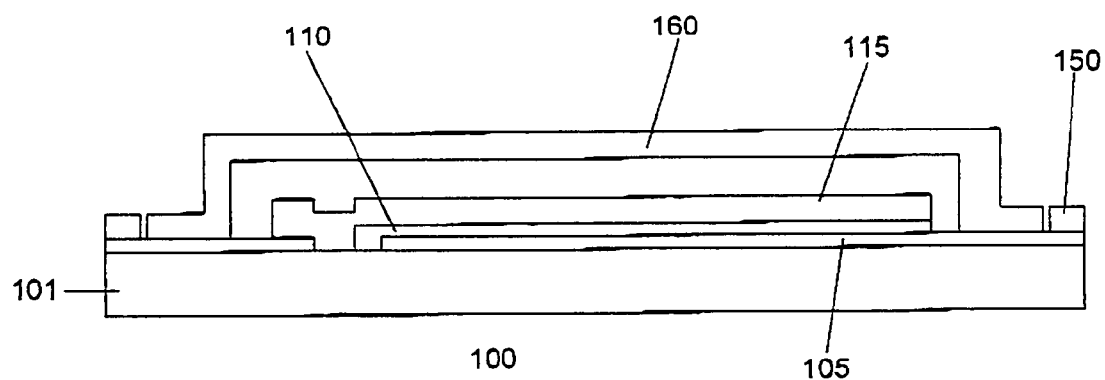
FIG. 1 shows a conventional OLED device.
Figure 2:
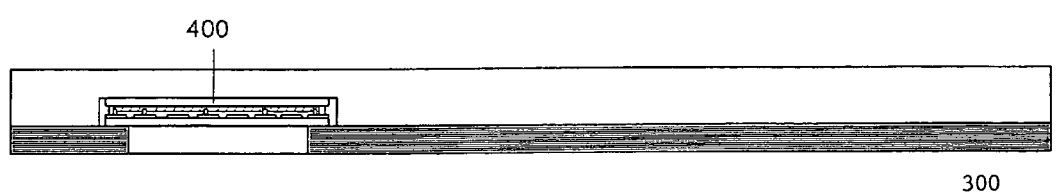
FIG. 2 shows one embodiment of the invention integrated into a chip card.
Figure 3A:
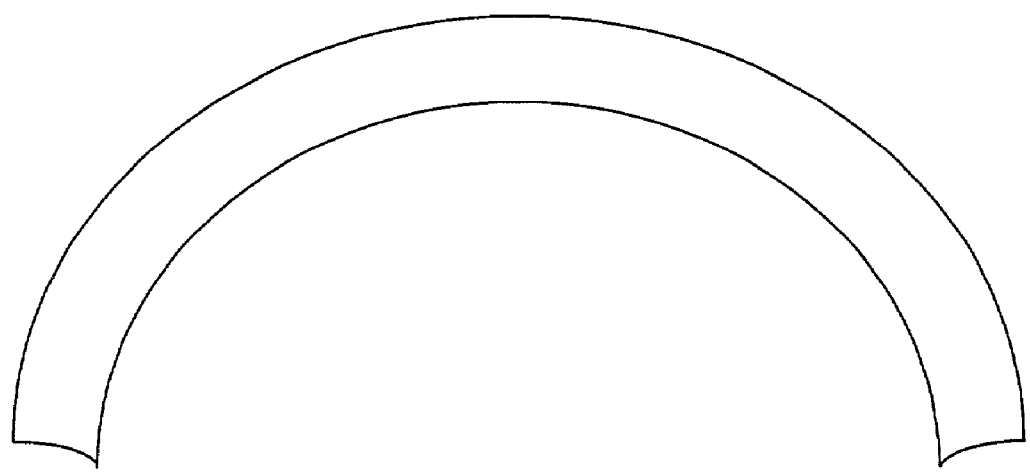
FIG. 3(a) shows the result of bending a smart card containing a conventional display without metal reinforcement.
Figure 3B:
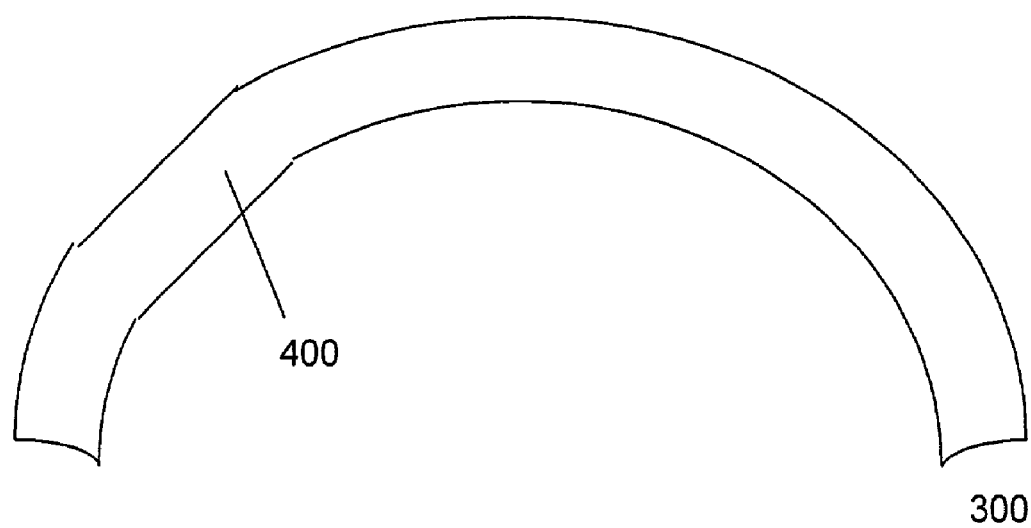
FIG. 3(b) shows the result of bending a chip card containing a display with metal reinforcement, according to one embodiment of the invention.

FIG. 2 shows a fabricated display 400, according to one embodiment of the invention, integrated into a flexible chip card 300. Typically, the chip card has outer dimensions of 86 mm by 54 mm with a thickness of 0.7 mm. For a seven-segment display, for example, the OLED display typically occupies an area of 22 mm by 10 mm. Since the display occupies a small fraction of the entire chip card area, the bending motion applied during a bending test can be restricted to the region not occupied by the display. Hence, the non-display area absorbs the mechanical strain introduced to the card during bending, as shown in FIG. 3(b), and the display remains undamaged. FIG. 3(a) shows the shape of the card that contains a display not reinforced by metal. Without protection from the metal cover, the display will be subjected to mechanical strain that may cause breakage.

Figure 4:
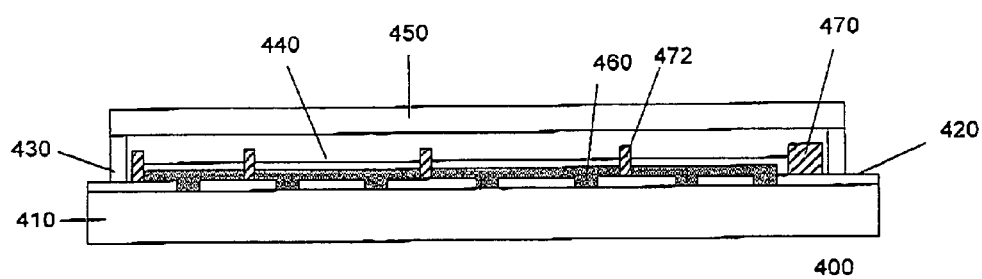
FIG. 4 shows one embodiment of the invention.

FIG. 4 shows one embodiment of the invention. A thin or ultra thin glass substrate 410 is provided. The glass substrate, for example, can be made from silicate glass such as borosilicate glass. Other transparent materials, such as sodalime glass or other types of glass, are also useful. Typically, the thickness of the thin glass substrate is less than about 0.4 mm, preferably about 0.01–0.2 mm, and more preferably about 0.03–0.2 mm.

A conductive layer 420 is deposited on the substrate. The conductive layer is then patterned, selectively removing portions thereof as desired. The patterned conductive layer serves as first electrodes for the OLED cells.

In a preferred embodiment, a dielectric layer 470 is deposited on the substrate after the conductive layer is patterned. The dielectric layer, in one embodiment, comprises a photosensitive layer, such as photosensitive resist or polyimide. Other types of photosensitive layers are also useful. The thickness of the layer is typically less than 0.5 mm. The dielectric layer is patterned to form isolation pillars 472 on the substrate, isolating the cathode materials. These pillars also support the layers above it and improve the flexibility of the device by about 10 to 30 percent.

If a resist is used, the resist is patterned by selectively exposing it to radiation through a mask and developing it to remove the exposed or unexposed portions, depending on whether a positive or negative active resist is used. If a non-photosensitive layer is used, a resist layer is deposited and patterned to serve as an etch mask for patterning the non-photosensitive layer using, for example, an anisotropic etch such as a reactive ion etch (RIE).

One or more organic functional layers 460 are formed on the substrate, covering the conductive layer. In one embodiment, the functional organic layers comprise a conjugated polymer or a low molecular material such as $Alq_3$. Other types of functional organic layers are also useful. Typically, the thickness of the organic layers is about 2–200 nm. The organic layer is then patterned, removing portions thereof to expose the anode for bond pad connections.

A second conductive layer 440 is deposited over the substrate to serve as the cathode. The second conductive layer comprises a conductive material such as Ca, Mg, Ba, Ag or a mixture thereof. The top electrode strips are typically orthogonal to the bottom electrode strips. Forming top electrode strips that are diagonal to the bottom electrode strips is also useful. The intersections of the top and bottom electrode strips form organic LED pixels.

A flat lid 450 is mounted on the substrate to encapsulate the device according to one embodiment. The lid layer comprises preferably of metal (e.g. stainless steel alloy, aluminium alloy). Typically, the thickness of the lid layer 0.04–0.4 mm. The lid should have higher stiffness and ductility than the substrate, and good resistance against oxidation and chemicals. The thickness of the lid and substrate stack is preferably less than 0.6 mm so that it can be easily integrated into the chip card.

Various techniques can be used attach the lid to the substrate. In one embodiment, an adhesive 430 is used to mount the lid layer. Adhesives such as self-hardening adhesives, UV or thermal curable adhesives, or hot melt adhesives are useful. Other techniques that employ low temperature solder materials, ultrasonic bonding, or welding techniques using inductance or laser welding are also useful.

Figure 5:
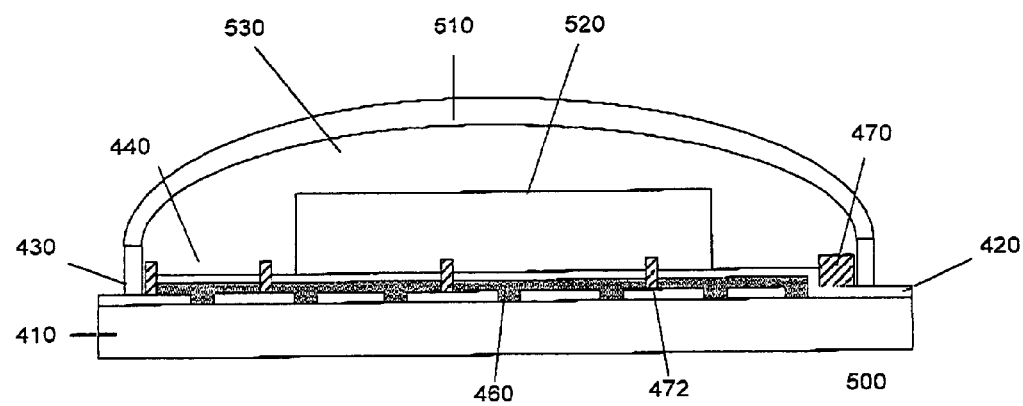
FIGS. 5–7 show other embodiments of the invention.
Figure 6A:
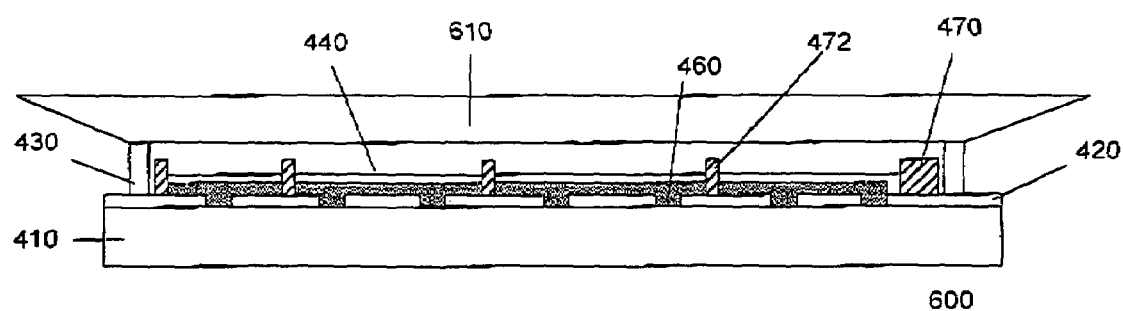
Figure 6B:
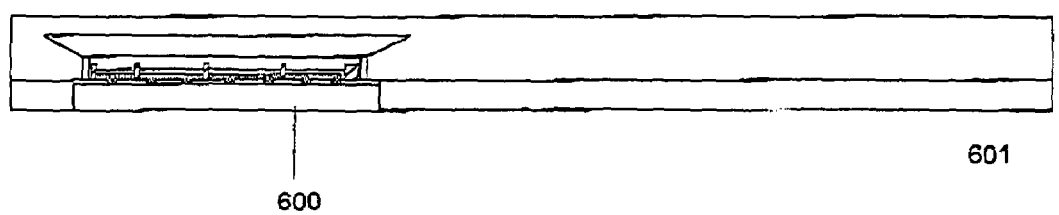

In another embodiment shown in FIG. 5, a stamped metal lid 510 containing a cavity 530 can be used to encapsulate the device. The cavity can accommodate some desiccant material 520 (e.g. getter or scavenger) to absorb residual moisture and oxygen. Alternatively, the cover lid can extend the actual outer dimensions of the substrate to facilitate integration of the display into the chip card by mechanical interlocking. The metal lid can be shaped (e.g. rounded, flat or wedge-shaped) to avoid high stress at the edge of the display. Referring to FIG. 6*a*, a wedge-shaped metal lid 610 is used to encapsulate the device. The fabricated device 600 is integrated into the flexible chip card as shown in FIG. 6*b*.

Figure 7:
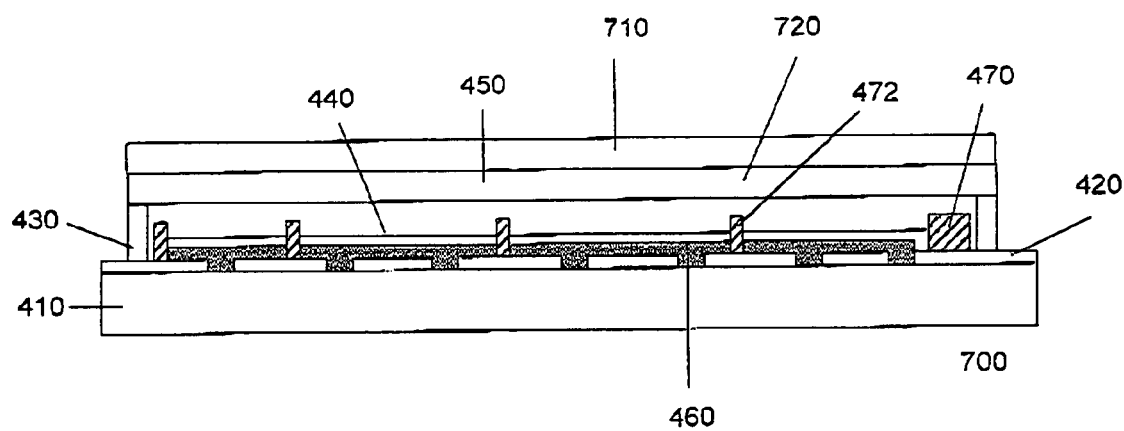

In another embodiment shown in FIG. 7, a thin and flexible cover 720 (e.g. glass with thickness of 0.05 mm) is used first to encapsulate the device. A flat metal reinforcement 710 is subsequently mounted on the thin cover.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A device used in a flexible application comprising:
   a substrate formed from a brittle material, the substrate includes an active device region, the active device region of the substrate provides a surface on which active components are formed; and
   a rigid support lid attached to the substrate, the rigid support lid encapsulating the active device region, wherein the rigid support lid has a higher stiffness and ductility than the substrate to mechanically support the substrate.

2. The device of claim 1 wherein the device comprises an OLED device having OLED cells in the active device region.

3. The device of claim 2 wherein the device is integrated into an interior of a relatively larger flexible substrate.

4. The device of claim 3 wherein the area occupied by the device comprises a small fraction of the total area of the relatively larger flexible substrate.

5. The device of claim 4 wherein the relatively larger flexible substrate comprises a chip card.

6. The device of claim 5 wherein the substrate comprises a transparent material.

7. The device of claim 6 wherein the substrate comprises glass.

8. The device of claim 7 wherein the material of the rigid support lid comprises metal.

9. The device of claim 8 wherein the rigid support lid comprises a thickness of about 0.04 mm to 0.4 mm.

10. The device of claim 9 wherein the substrate comprises a thickness of less than 0.4 mm.

11. The device of claim 10 wherein the device comprises a thickness of less than 0.6 mm.

12. The device of claim 11 wherein the substrate comprises glass.

13. The device of claim 12 wherein the rigid support lid comprises different shapes.

14. The device of claim 13 wherein the rigid support lid comprises a stamped shape, the rigid support lid forming a cavity over the substrate.

15. The device of claim 14 wherein a desiccant material is deposited in the cavity to absorb residual moisture and oxygen.

16. The device of claim 13 wherein the rigid support lid comprises a thin and flat shape.

17. The device of claim 16 wherein the rigid support lid comprises a shape that extends the outer dimensions of the substrate.

18. The device of claim 17 wherein the rigid support lid comprises a round shape.

19. The device of claim 17 wherein the rigid support lid comprised a wedge shape.

20. The device of claim 1 wherein the device is integrated into an interior of a flexible second substrate.

21. The device of claim 20 wherein the area occupied by the device comprises a small fraction of the total area of the flexible second substrate.

22. The device of claim 21 wherein the flexible second substrate comprises a chip card.

23. The device of claim 22 wherein the device comprises a thickness of less than 0.6 mm.

24. The device of claim 22 wherein the rigid support lid composes different shapes.

25. The device of claim 24 wherein the rigid support lid material comprises metal.

26. The device of claim 25 wherein the device comprises a thickness of less than 0.6 mm.

27. The device of claim 26 wherein the rigid support lid comprises different shapes.

28. A device comprising:
    a substrate including a device region serving as a support surface on which active components are formed, wherein the substrate comprises a brittle material;
    a lid on the substrate, the lid encapsulating the device region of the device, the lid forming a cavity between the lid and the device region; and
    a support layer an the lid, the support layer and the lid forms a rigid support lid wherein the rigid support lid has a higher stiffness and ductility than the substrate to mechanically support the substrate.

29. The device of claim 28 wherein the device comprises an OLED device.

30. The device of claim 29 wherein the device is integrated into an interior of a flexible second substrate.

31. The device of claim 30 wherein the area occupied by the device comprises a small fraction of the total area of the flexible second substrate.

32. The device of claim 31 wherein the flexible second substrate comprises a chip card.

33. The device of claim 32 wherein the rigid support lid comprises different shapes.

34. The device of claim 33 wherein the rigid support lid comprises a thin and flat shape.

35. The device of claim 34 wherein the rigid support lid comprises a shape that extends the outer dimensions of the substrate.

36. The device of claim 35 wherein the rigid support lid comprises a round shape.

37. The device of claim 35 wherein the rigid support lid comprises a wedge shape.

38. The device of claim 28 wherein the device is integrated into an interior of a flexible second substrate.

39. The device of claim 38 wherein the area occupied by the device comprises a small fraction of the total area of the flexible second substrate.

40. The device of claim 39 wherein the flexible second substrate comprises a chip card.

41. The device of claim 40 wherein the support layer comprises a material more stiff than the substrate.

42. A device comprising:
a substrate including a device region, the substrate is brittle and provides a surface on which active components are formed;
isolation pillars formed on the substrate, the pillars isolating cathode materials; and
a rigid support lid mounted on the substrate, the rigid support lid encapsulating the device, wherein the rigid support lid has a higher stiffness and ductility than the substrate to mechanically support the substrate.

43. A method of forming a device comprising:
providing a brittle substrate including an active device region thereon, the active device region serving as a support surface on which active components are formed;
forming at least one active component on the active device region; and
mounting a rigid support lid on the substrate to encapsulate the active device region, wherein the rigid support lid has a higher stiffness and ductility than the substrate to mechanically support the substrate.

44. A flexible first substrate comprising: an OLED device including:
a second substrate having a device region serving as a support on which at least one OLED cell is formed, wherein the second substrate comprises a brittle material; and
a rigid support lid mounted on the second substrate to encapsulate the device region, the rigid support lid has a higher stiffness and ductility than the second substrate to mechanically support the second substrate;
wherein the OLED device is integrated into the interior of the flexible first substrate, the flexible first substrate being relatively larger than the OLED device.

45. The flexible first substrate of claim 44 comprises a chip card.

46. The flexible first substrate of claim 44 wherein the area occupied by the OLED device is smaller than the total area of the flexible first substrate.

47. The flexible first substrate of claim 44 wherein the support lid comprises a shape that extends the outer dimensions of the second substrate.

48. The flexible first substrate of claim 44 wherein the rigid support lid of the OLED device comprises a flexible cover and a rigid support layer on the cover.

49. The first substrate of claim 44 further comprising:
isolation pillars formed on the second substrate of the OLED device, the isolation pillars isolating the material of the second electrodes and improving the flexibility of the OLED device.

50. The flexible first substrate of claim 44 wherein the second substrate comprises a transparent material.

51. The flexible first substrate of claim 50 wherein the second substrate comprises glass.

52. The first substrate of claim 51 wherein the second substrate comprises a thickness of less than 0.4 mm.

53. The flexible first substrate of claim 52 wherein the OLED device comprises a thickness of less than 0.6 mm.

54. The flexible first substrate of claim 44 wherein the rigid support lid comprises metal.

55. The flexible first substrate of claim 54 wherein the rigid support lid comprises a thickness of about 0.04 mm to 0.4 mm.

56. The flexible first substrate of claim 44 wherein the rigid support lid comprises a round shape.

57. The flexible first substrate of claim 56 wherein the rigid support lid comprises a wedge shape.

58. The flexible first substrate of claim 44 wherein the rigid support lid comprises a stamped shape, the rigid support lid forming a cavity over the device region.

59. The flexible first substrate of claim 58 wherein a desiccant material for the absorption of residual moisture and oxygen is deposited in the cavity.

60. The flexible first substrate of claim 44 wherein the second substrate of the OLED device forms a part of the surface of the flexible first substrate.

61. A flexible first substrate comprising:
an OLED device including:
a second substrate having a device region serving as a support on which at least one OLED cell is formed, wherein the second substrate comprises a brittle material: and a support lid mounted on the second substrate to encapsulate the device region, the support lid has a higher stiffness and ductility than the second substrate to mechanically support the second substrate, wherein the OLED device is integrated into the interior of the first substrate, the first substrate being larger than the OLED device.

62. A flexible first substrate comprising:
an OLED device including:
a second substrate having a device region serving as a support on which at least one OLED cell is formed having first and second electrodes separated by an organic layer, wherein the second substrate comprises a brittle material;
a support lid mounted on the second substrate to encapsulate the device region, the support lid has a higher stiffness and ductility than the second substrate to mechanically support the second substrate; and isolation pillars formed on the second substrate of the OLED device, the isolation pillars serve to isolate conductive materials in the device region and improve the flexibility of the device,
wherein the OLED device is integrated into the interior of the first substrate, the first substrate being larger than the OLED device.

* * * * *